United States Patent [19]

Denley

[11] 4,391,845
[45] Jul. 5, 1983

[54] METHOD OF MAKING A MEMBRANE SWITCH

[75] Inventor: Ronald S. Denley, Woodstock, Ill.

[73] Assignee: Oak Industries Inc., Rancho Bernardo, Calif.

[21] Appl. No.: 323,023

[22] Filed: Nov. 19, 1981

[51] Int. Cl.³ .............................................. H01H 11/06
[52] U.S. Cl. ............................. 427/58; 427/96; 427/282; 427/207.1; 200/159 B; 200/5 A; 200/292
[58] Field of Search ............ 29/622; 200/159 B, 5 A, 200/292; 427/58, 96, 282, 207.1

[56] References Cited

U.S. PATENT DOCUMENTS

| | | | |
|---|---|---|---|
| 3,995,126 | 11/1976 | Larson | 200/159 B X |
| 4,184,043 | 1/1980 | Hildering | 427/282 X |
| 4,317,013 | 2/1982 | Larson | 200/5 A |
| 4,320,573 | 3/1982 | Larson | 200/5 A X |

Primary Examiner—John D. Smith
Assistant Examiner—Bernard F. Plantz
Attorney, Agent, or Firm—Kinzer, Plyer, Dorn & McEachran

[57] ABSTRACT

This invention relates to a method of fabricating a membrane switch of the type having a substrate, a flexible membrane, electrical conductors formed on the membrane and substrate, and an intervening spacer between the sets of conductors. The conductors include a plurality of switch sites which are in facing relation to define a specific switch. The spacer means comprises a plurality of individual spacer areas which are located remote from the switch sites. The manufacturing method uses a multiple pass screen printing operation. During the first pass a set of conductors is formed from conductive ink on either the membrane or substrate. Also, during the first screening pass a first layer of the spacer areas is formed from the same conductive material as the set of conductors. On subsequent screening passes additional layers are deposited on the spacer areas to build up the thickness of the areas so that the spacer thickness is greater than that of the conductors. The location of the spacer areas and the formation of the first layer of the spacer areas from conductive material permits elimination of one screening pass and subsequent registration problems.

4 Claims, 4 Drawing Figures

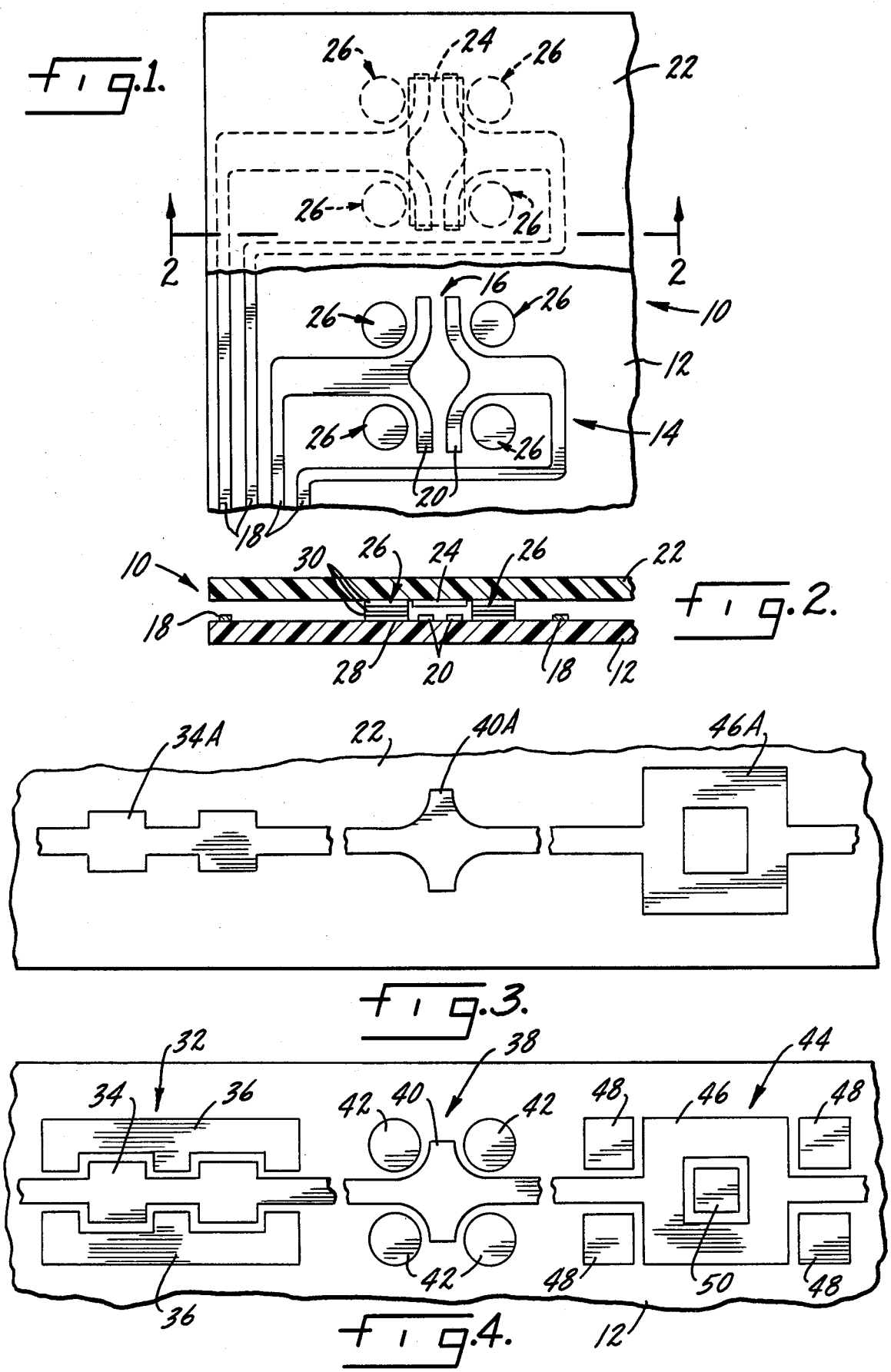

METHOD OF MAKING A MEMBRANE SWITCH

SUMMARY OF THE INVENTION

This invention relates to membrane switches and is particularly directed to a method of fabricating a membrane switch using a multiple pass screen printing operation.

A primary object of the present invention is the elimination of one of the multiple passes necessary to make a membrane switch by the screen printing process.

Another object is a membrane switch formed by screen printing wherein the pressure needed to actuate the switch can be varied by controlling the size and location of the spacer means.

Another object is a membrane switch having a spacer which can be made of electrically conductive material.

Other objects will appear in the following specification and drawings.

BRIEF DESCRIPTION OF THE DRAWINGS

FIG. 1 is a plan view of a membrane switch with a portion of the membrane cut away to show the underlying components.

FIG. 2 is a section taken substantially along line 2—2 of FIG. 1.

FIG. 3 is a plan view of the underside of a membrane showing alternate configurations for the switch sites.

FIG. 4 is a plan view of a substrate, showing the alternate switch sites and spacer means to be used in conjunction with the membrane of FIG. 3.

DESCRIPTION OF A PREFERRED EMBODIMENT

This invention is concerned with membrane switches and a method of making them. FIG. 1 illustrates a membrane switch 10. The switch has an electrically insulative substrate 12 which may be either rigid or flexible. A first set of electrical conductors 14 is formed on the substrate 12. The conductors include a plurality of switch sites 16 with connecting leads 18. In the illustrated embodiment the switch sites 16 comprise a pair of spaced electrodes 20.

Overlying the substrate is a flexible membrane 22. The membrane can be made of any flexible sheet material for example polyester sold by Dupont under the trademark "Mylar". The membrane is on the order of 5 mils thick. A second set of electrical conductors is formed on the underside of the membrane. In the illustrated embodiment the second set of conductors comprises a plurality of switch sites 24 which are shorting bars. When the switch is actuated the shorting bars contact the spaced electrodes 20, thereby shorting the electrodes and closing the switch. When the actuating pressure is released the shorting bar returns to its normal position, spaced from the electrodes.

The electrical conductors are normally held in spaced, non-contacting relation by a spacer means. The spacer means includes a plurality of spacer areas 26 formed either on the membrane or substrate. In FIG. 1 the spacer areas 26 are on the substrate 12. The spacer areas are located remote from the switch sites 16 and 24. There is no contact between the spacer areas and the electrical conductors.

A well-known method of forming the conductors on the membrane and substrate is to screen print a conductive ink in the desired configuration and then allow the ink to dry. This method is particularly advantageous for forming complicated arrangements of conductors. While the conductors can be readily formed by screen printing, it is somewhat more difficult to apply the spacer by screening techniques. This is due to the fact that the spacer must have a greater thickness than the electrical conductors in order to perform its function of holding the conductors apart. The actuation force of the switch can be increased by increasing the spacer thickness. Variable spacer thickness can be accomplished by a multiple pass screen printing operation. The spacer thickness is gradually built up in several layers, one layer being applied during each screening pass. However, multiple-pass screening adds to the time and the cost of making a membrane switch. The present invention permits elimination of one screening pass by forming both the set of conductors and the first layer of the spacer means during the initial screening pass. Thus the first layer of the spacer means is formed of the same conductive material as the electrical conductors. This can be done without shorting the switch sites 16 or the leads 18 by placing the spacer areas 26 at locations remote from the switch sites. As can be seen in FIG. 1, the spacer areas 26 are arrayed in a four corner pattern which surrounds the switch sites 16 but does not contact either the electrodes 20 or their leads 18. Thus, the fact that the spacer areas are themselves conductive does not affect the electrical circuit because the areas 26 are spaced from the conductors. The gap between a spacer area and an electrode is preferably on the order of 20 mils.

FIG. 2 illustrates how the conductors and spacer areas are applied to the substrate 12. During a first screening pass the leads 18, the electrodes 20 and a first layer 28 of the spacer areas 26 are formed. During subsequent passes additional layers 30 are formed on top of the first layer 28 to build up the final thickness of the spacer area 26. In FIG. 2 there are four layers at each spacer area. The additional layers 30 can be formed of the same conductive ink used to form a first layer. Or the additional layers 30 could be formed of non-conductive ink. A further option is to form the top layer of the spacer area of an adhesive material to hold the membrane in place. While the above discussion has assumed the spacer areas are formed on the substrate, it will be understood that the spacer areas could also be applied to the underside of the membrane.

While FIGS. 1 and 2 show a switch site in the form of a pair of spaced electrodes 20 and a shorting bar 24 in spaced, facing relation, it will be understood that other types of conductor configurations could be used. FIG. 4 shows three variations of switch sites with corresponding spacer configurations. Switch 32 has a central electrode 34 and outer spacer bars 36. Switch 38 has a t-shaped electrode 40 and spacer areas 42. Switch 44 has a box shaped electrode 46 with four corner spacer areas 48 and the central spacer area 50. It will be understood that each of these switches would have a corresponding electrode in facing relation on the underside of the membrane. These electrodes are shown in FIG. 3. Electrodes 34A, 40A and 46A cooperate with electrodes 34, 40 and 46 to complete the switches. The accompanying leads are not shown. Each of these switch and spacer configurations can be formed by making a first screening pass to form the electrode and a first layer of the spacer areas. The spacer areas are then built up by making additional screening passes. While a preferred form of the invention has been shown and described it will be understood that many alterations and could be made thereto. Therefore the invention is not to be limited to the specific forms illustrated.

I claim:

1. In a method of making a component of a membrane switch in a multiple-pass screen printing process, the membrane switch being of the type having a substrate, a flexible membrane, a first set of electrical conductors on the substrate, a second set of electrical conductors on the membrane, the conductor sets including a plurality of switch sites in facing relation, and spacer means normally holding the conductor sets in spaced, non-contacting relation, the spacer means including a plurality of spacer areas on either the membrane or substrate at locations remote from the first and second sets of electrical conductors, the improved method comprising the steps of:

(a) forming one of the sets of conductors by screening a conductive material on the substrate or membrane in a first screening pass;

(b) forming a first layer of the spacer areas from the conductive material during the first screening pass;

(c) forming additional layers of the spacer areas by subsequent screening passes which deposit material only on the spacer areas so that the spacer means thickness is greater than that of the conductors.

2. The method of claim 1 wherein the spacer material deposited during said subsequent screening passes is electrically conductive.

3. The method of claim 1 wherein the spacer material deposited during said subsequent screening passes is electrically non-conductive.

4. The method of claim 1 further including the step of applying adhesive material to the spacer areas.

* * * * *